US005260266A

United States Patent [19]

Herd et al.

[11] Patent Number: 5,260,266

[45] Date of Patent: Nov. 9, 1993

[54] HIGH-TC SUPERCONDUCTING LEAD ASSEMBLY IN A CRYOSTAT DUAL PENETRATION FOR REFRIGERATED SUPERCONDUCTIVE MAGNETS

[75] Inventors: Kenneth G. Herd; Evangelos T. Laskaris, both of Schenectady, N.Y.

[73] Assignee: General Electric Company, Schenectady, N.Y.

[21] Appl. No.: 833,194

[22] Filed: Feb. 10, 1992

[51] Int. Cl.[5] .................... H01B 12/00; H01L 39/12

[52] U.S. Cl. .................................... 505/1; 62/511; 505/780; 505/891

[58] Field of Search ...................... 505/891, 780, 1; 62/51.1

[56] References Cited

U.S. PATENT DOCUMENTS

| | | | |
|---|---|---|---|
| 4,635,450 | 1/1987 | Laskaris | 505/892 |
| 4,895,832 | 1/1990 | Chang et al. | 505/780 |
| 4,918,308 | 4/1990 | Neitzel et al. | 62/51.1 |
| 5,129,232 | 7/1992 | Minas et al. | 505/892 |

*Primary Examiner*—Ronald C. Capossela

*Attorney, Agent, or Firm*—James R. McDaniel; Paul R. Webb, II

[57] ABSTRACT

This invention relates to high-Tc superconducting lead assemblies in a cryostat dual penetration for refrigerated superconductive magnets. Such structures of this type, generally, provide electrically isolated current paths with minimal heat leak between the 10K thermal station and the 50K thermal station while allowing for differential thermal contraction in the assembly, thus avoiding undesirable stresses in the leads.

11 Claims, 2 Drawing Sheets

HIGH-TC SUPERCONDUCTING LEAD ASSEMBLY IN A CRYOSTAT DUAL PENETRATION FOR REFRIGERATED SUPERCONDUCTIVE MAGNETS

CROSS REFERENCE TO RELATED APPLICATIONS

This application is related to commonly assigned U.S. patent applications Ser. Nos. 07/833,195, now allowed and 07/833,225, now allowed all to Herd et al. and entitled "Cold Head Mounting Assembly in a Cryostat Dual Penetration For Refrigerated Superconductive Magnets" and "Thermal Busbar Assembly in a Cryostat Dual Penetration For Refrigerated Superconductive Magnets".

BACKGROUND OF THE INVENTION

1. Field of the Invention

This invention relates to high-Tc superconducting lead assemblies in a cryostat dual penetration for refrigerated superconductive magnets. Such structure of this type, generally, provide electrically isolated current paths with minimal heat leak between the 10K thermal station and the 50K thermal station while allowing for differential thermal contraction in the assembly, thus avoiding undesirable stresses in the leads.

2. Description of the Related Art

It is known in prior refrigerated superconductive magnets to use a cryorefrigeration system which employs a single cold head. The major limitation of these system is the fact that if the single cold head malfunctions, the superconductive magnet may not be properly cooled, which could adversely affect the performance of the magnet. In short, the system typically was only as reliable as the cryorefrigerator itself. Therefore, a more advantageous system would be presented if this unreliability were reduced or eliminated.

In order to increase the reliability in refrigerated superconductive magnet systems, a redundant cold head system for a refrigerated magnet has been developed. Exemplary of such prior redundant systems is U.S. Pat. No. 5,111,665 ('665), to R. A. Ackermann, entitled "Redundant Cryorefrigerator System For a Refrigerated Superconductive Magnet", now allowed and assigned to the same assignee as the present invention. In the ('665) application, one cold head of the two used in the system cools the magnet. A redundant cold head does not contact the magnet and is held in a raised, standby position. If the main cold head malfunctions, the main cold head is raised so that it can be repaired, serviced or replaced and the redundant cold head is lowered to contact the magnet. In this manner, the cooling of the magnet should be substantially continuous. While this cryorefrigeration system has allowed the magnet to be run continuously, further reductions in the amount of vibration reaching the magnet would be achieved if the cold heads were not rigidly attached to the magnet. Vibration in the magnet is not desired because the vibration can cause artifacts in the image produced by the magnet. Consequently, further reductions in the vibration in the magnet while continuously cooling the magnet would be advantageous.

In the ('665) application, current leads are thermally connected to the thermal shield so that heat conducting down the leads from ambient temperature is intercepted at the first thermal station. Further reductions in the amount of heat conducting down the current leads between the thermal shield and the second thermal station would be advantageous.

It is apparent from the above that there exists a need in the art for a high-Tc superconducting lead assembly which minimizes the heat conducting down the leads from the first thermal station to the second thermal station and which is capable of allowing the magnet to operate continuously, but which at the same time substantially prevents thermal stresses from adversely affecting the leads. It is a purpose of this invention to fulfill this and other needs in the art in a manner more apparent to the skilled artisan once given the following disclosure.

SUMMARY OF THE INVENTION

Generally speaking, this invention fulfills these needs by providing a superconducting lead assembly for a superconductive magnet, comprising a heat station means, a first pair of lead means thermally and flexibly connected to and electrically insulated from said heat station means, a thermal shield means thermally and flexibly connected to, and electrically insulated from said first pair of lead means, and a second pair of lead means thermally attached to said shield means.

In certain preferred embodiments, the heat station means is a 10K station. Also, the first lead means are constructed of $YBa_2Ca_3O_7$ and the second lead means are constructed of OFHC copper. Also, the thermal shield means is a 50K shield. Finally, the first lead means are connected to the heat station means by flexible connectors made of laminated copper sheets and the first and second lead means are conduction cooled and electrically insulated from the shield and station means by dielectric materials.

In another further preferred embodiment, the heat leak between the thermal shield and heat station is minimized by use of the conduction-cooled superconducting leads.

The preferred superconducting lead assembly according to this invention, offers the following advantages: reduced heat leak and isolation from thermal stresses. In fact, in many of the preferred embodiments, these factors of heat leak and thermal stresses are optimized to an extent considerably superior than heretofore achieved in prior, known current lead assemblies.

BRIEF DESCRIPTION OF THE DRAWINGS

The above and other features of the present invention which will become more apparent as the description proceeds are best understood by considering the following detailed description in conjunction with the accompanying drawings wherein like characters represent like parts throughout the several views and in which.

DETAILED DESCRIPTION OF THE INVENTION

Figure 1:
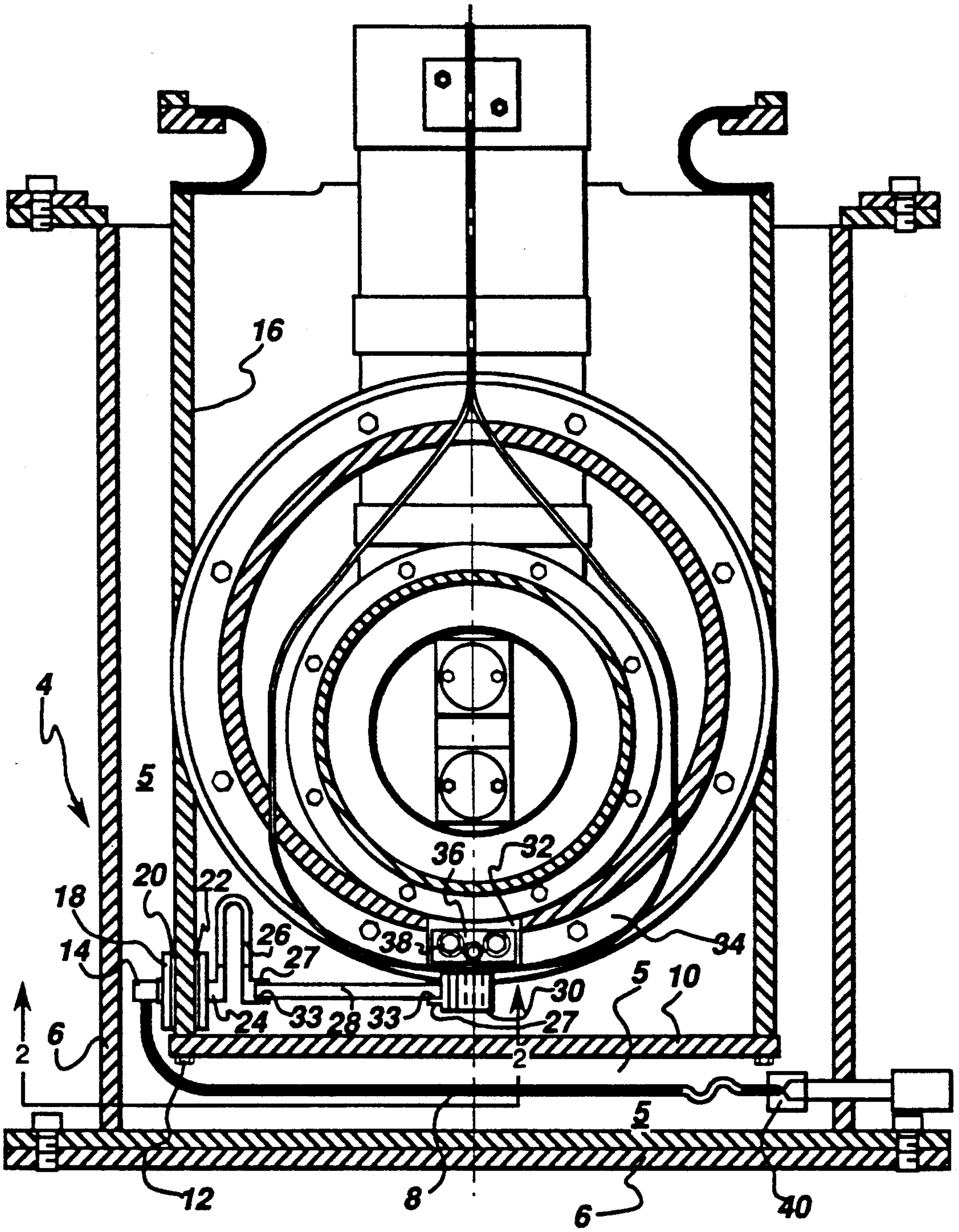
FIG. 1 is a end view of a High-Tc superconducting lead assembly, according to the present invention.

With reference first to FIG. 1, high-Tc superconductive lead assembly 4 is illustrated. Assembly 4 includes, in part, multilayer insulation 5 and vacuum enclosure 6. Insulation 5, preferably, is constructed of aluminized mylar® polyester film and enclosure 6 is constructed of steel. Located within enclosure 6, in part, is warm section lead 8 and 50K shields 10 and 16. Lead 8 and shields 10 and 16, preferably, are constructed of OFHC copper. Shields 10 and 16 are attached to each other by conventional fasteners 12. Lead 8 is thermally attached to post 14 by a conventional solder joint. Lead 8 is also thermally attached to a conventional vacuum feedthrough 40, for example, a vacuum feedthrough manufactured by Ceramaseal, Inc.

Post 14 is rigidly attached to plate 18 by conventional welding or soldering techniques. Plate 18 and post 14, preferably, are constructed of OFHC copper. Dielectric 20 is located between plate 18 and shield 16. Dielectric 20, preferably, is constructed of an alumina and indium gasket. Located on the other side of shield 16 is dielectric 22 which is constructed the same as dielectric 20. Dielectrics 20,22 are used to electrically isolate plate 18 from thermal shield 16.

Plate 23 which is constructed of the same material as plate 18 is rigidly attached to dielectric 22 and post 24. Post 24 is constructed of the same material as post 14. Post 24 is rigidly attached to flexible connection 26 by conventional soldering or welding. Connection 26, preferably, is constructed of laminated copper sheets. Connection 26 is rigidly attached to extension 27 by convention soldering or welding. Extension 27, preferably, is constructed of OFHC copper. Extension 27 is rigidly attached to cold section lead 28 by a conventional solder joint. Lead 28, preferably, is constructed of $YBa_2Cu_3O_7$ with a silver contact 33 which is deposited on lead 28 by conventional deposition techniques.

Figure 2:
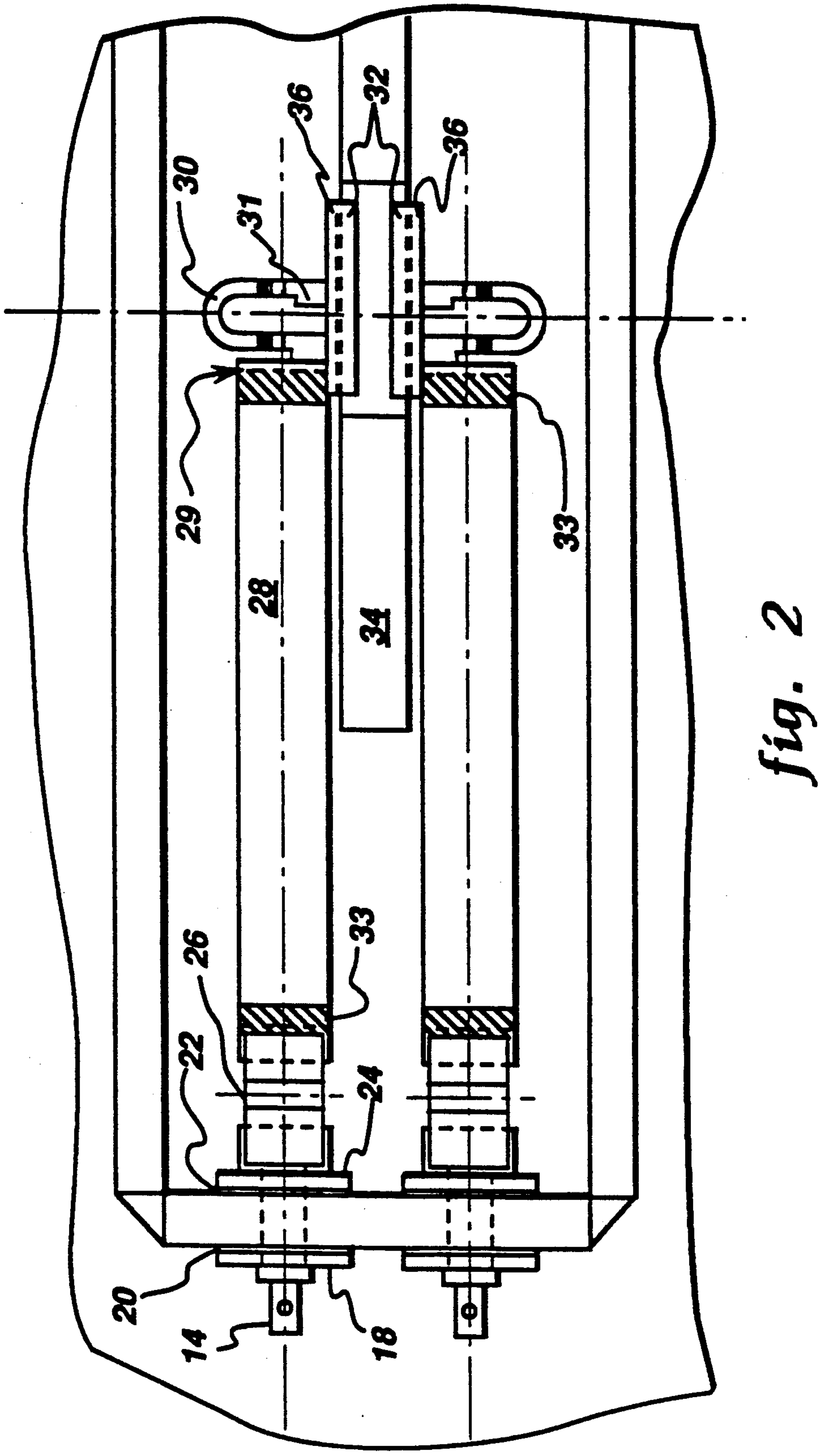
FIG. 2 is a bottom view of a High-Tc superconducting lead assembly, taken along line 2—2 in FIG. 1.

With respect to FIG. 2, lead 28 is rigidly attached to extension 29 by a conventional solder joint. Extension 29 is rigidly attached to flexible connection 30 by conventional soldering or welding. Connection 30, preferably, is constructed of laminated copper sheets. Connection 30 is rigidly attached to extension 31 by conventional soldering or welding. Extension 31, preferably, is constructed of OFHC copper. Extension 31 is rigidly attached to plate 38 by conventional soldering or welding. Plate 36, preferably, is constructed of OFHC copper. Plate 36 is rigidly attached to dielectric 32 by conventional fastener 38. Dielectric 32 is constructed in the same manner as dielectric 18. Dielectric 32 is rigidly attached to station 34 by a conventional attachment (not shown).

Once given the above disclosure, many other features, modifications and improvements will become apparent to the skilled artisan. Such features, modifications and improvements are, therefore, considered to be a part of this invention, the scope of which is to be determined by the following claims.

What is claimed is:

1. A superconducting lead assembly for a superconductive magnet wherein said assembly is comprised of:
   - a heat station means;
   - a first pair of lead means thermally and flexibly connected to, and electrically insulated from said heat station means;
   - a thermal shield means operatively connected to said superconductive magnet and thermally and flexibly connected to, and electrically insulated from said first pair of lead means; and
   - a second pair of lead means thermally attached to said shield means.

2. The assembly, according to claim 1, wherein said heat station means is further comprised of
   - a 10K heat station.

3. The assembly, according to claim 1, wherein said first pair of lead means is further comprised of:
   - a superconducting ceramic material.

4. The assembly, according to claim 1, wherein said assembly is further comprised of:
   - a first flexible connection substantially located between said heat station means and said first pair of lead means.

5. The assembly, according to claim 4, wherein said first flexible connections are further comprised of:
   - laminated copper sheets.

6. The assembly, according to claim 1, wherein said shield means is further comprised of:
   - a 50K shield.

7. The assembly, according to claim 1, wherein said second pair of lead means is further comprised of:
   - copper.

8. The assembly, according to claim 1, wherein said assembly is further comprised of:
   - a second flexible connection substantially located between said first pair of lead means and said shield means.

9. The assembly, according to claim 8, wherein said second flexible connection is further comprised of:
   - laminated copper sheets.

10. The assembly, according to claim 1, wherein said assembly is further comprised of:
   - a first dielectric means substantially located between said first pair of lead means and said shield means.

11. The assembly, according to claim 1, wherein said assembly is further comprised of:
   - a second dielectric means substantially located between said heat station means and said first pair of lead means.

* * * * *